US011443084B2

(12) United States Patent
Ma et al.

(10) Patent No.: US 11,443,084 B2
(45) Date of Patent: Sep. 13, 2022

(54) METHOD FOR DETERMINING PRODUCTIVE CAPACITY PARAMETERS AND PRODUCTIVE CAPACITY PARAMETERS GENERATING SYSTEM

(71) Applicant: PEGATRON CORPORATION, Taipei (TW)

(72) Inventors: Chun-Kuang Ma, Taipei (TW); Chang-Sheng Tsau, Taipei (TW); Shen-Hau Chang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 71 days.

(21) Appl. No.: 17/204,978

(22) Filed: Mar. 18, 2021

(65) Prior Publication Data

US 2021/0342504 A1 Nov. 4, 2021

(30) Foreign Application Priority Data

May 4, 2020 (TW) .................................. 109114817

(51) Int. Cl.
*G06F 1/00* (2006.01)
*G06F 30/20* (2020.01)
*G05B 13/04* (2006.01)

(52) U.S. Cl.
CPC ........... *G06F 30/20* (2020.01); *G05B 13/048* (2013.01)

(58) Field of Classification Search
CPC .... G06Q 10/06; G06Q 10/04; G06Q 10/0635; G06Q 10/06393; G05B 13/02; G05B 13/04; G05B 15/02; G05B 2219/2642; Y02P 80/10; Y02P 90/82
See application file for complete search history.

(56) References Cited

U.S. PATENT DOCUMENTS

| 5,968,790 A | * | 10/1999 | Van Rooijen | ........ C12G 1/0203 426/62 |
| 10,037,501 B2 | * | 7/2018 | Kaushik | ................. G06Q 10/04 |
| 2005/0142670 A1 | * | 6/2005 | Dobson | ................... G06Q 30/02 438/10 |
| 2019/0316948 A1 | * | 10/2019 | Karol | ..................... G16H 40/63 |

FOREIGN PATENT DOCUMENTS

CN 109118012 A 1/2019

* cited by examiner

*Primary Examiner* — John Kwon
(74) *Attorney, Agent, or Firm* — McClure, Qualey & Rodack, LLP

(57) ABSTRACT

A method of determining productive capacity parameters includes steps of: obtaining a plurality of parameters of a production line from a memory. By a productive capacity parameters generating system finishing the following steps of: combining parameters of production line to obtain a plurality of parametric combinations so as to generate a plurality of production capacity values; calculating a plurality of stimulation values according to production capacity values and parameters; when at least one stimulation value of stimulation values is greater than to or equals to a preset threshold, setting up at least one stimulation value of stimulation values as at least one related stimulation value; obtaining parameters of at least one target parametric combination of parametric combinations according to at least one related stimulation value; and providing parameters of at least one target parametric combination as productive capacity parameters of production line.

12 Claims, 3 Drawing Sheets

200 obtain a plurality of parameters of a production line from a memory ~210 combine the parameters of the production line to obtain a plurality of parametric combinations so as to generate a plurality of production capacity values by a productive capacity parameters generating system, which the production capacity values includes productions of the production line per preset time ~220 calculate a plurality of stimulation values according to the production capacity values and the parameters of the parametric combinations by the productive capacity parameters generating system ~230 set up at least one of the stimulation values as at least one related stimulation value by the productive capacity parameters generating system based on the at least one of the stimulation values being greater than or equal to a preset threshold, which the preset threshold includes a pre-setting definite value ~240 obtain parameters of at least one target parametric combination of the parametric combinations according to the at least one related stimulation value by the productive capacity parameters generating system ~250 provide the parameters of the at least one target parametric combination to be the productive capacity parameters of the production line by the productive capacity parameters generating system ~260

Fig. 2

METHOD FOR DETERMINING PRODUCTIVE CAPACITY PARAMETERS AND PRODUCTIVE CAPACITY PARAMETERS GENERATING SYSTEM

CROSS-REFERENCE TO RELATED APPLICATION

This application claims priority to Taiwan Application Serial Number 109114817, filed May 4, 2020, all of which are herein incorporated by reference.

BACKGROUND

Field of Invention

The present disclosure relates to an electronic system and a method. In detail, the present disclosure relates to a method for determining productive capacity parameters and a productive capacity parameters generating system.

Description of Related Art

General stimulation of a production line requires actual data for analysis or only stimulates a result of an entire production line. General stimulation of a production line cannot automatically determine specific part of a production line which needs to prove (e.g., numbers of the fixtures or cycle times of robot arms). Content of a production line must be manually adjusted according to a stimulated result. Content of a production line must be modified and improved step-by-step to achieve goals. Hence, there are technology defects and shortcomings in this field, which need to be solved.

SUMMARY

The present disclosure provides a method for determining productive capacity parameters. The method for determining productive capacity parameters includes the following steps: obtaining a plurality of parameters of a production line from a memory; combining the parameters of the production line to obtain a plurality of parametric combinations so as to generate a plurality of production capacity values by a productive capacity parameters generating system. The production capacity values include productions of the production line per preset time. The production capacity values include productions of the production line per preset time; calculating a plurality of stimulation values according to the production capacity values and the parameters of the parametric combinations by the productive capacity parameters generating system; based on the at least one of the stimulation values being greater than or equal to a preset threshold, setting up at least one of the stimulation values as at least one related stimulation value by the productive capacity parameters generating system, which the preset threshold includes a pre-setting definite value; obtaining parameters of at least one target parametric combination of the parametric combinations according to the at least one related stimulation value by the productive capacity parameters generating system; and providing the parameters of the at least one target parametric combination to be the productive capacity parameters of the production line by the productive capacity parameters generating system.

Another aspect of the present disclosure relates to a productive capacity parameters generating system. The productive capacity parameters generating system includes a memory, a parametric combinations circuit, a transfer circuit, a computation circuit, a judgment circuit, and a parameter generating circuit. The memory is configured to store a plurality of parameters of a production line. The parametric combinations circuit is configured to combine the parameters of the production line to obtain a plurality of parametric combinations. The transfer circuit is configured to transfer the parametric combinations to a plurality of servers so as to obtain a plurality of production capacity values. The production capacity values include productions of the production line per preset time. The computation circuit is configured to calculate a plurality of stimulation values according to the production capacity values and the parameters of the parametric combinations. Based on the at least one of the stimulation values being greater than or equal to a preset threshold, the judgment circuit is configured to set up at least one of the stimulation values as at least one related stimulation value. The preset threshold includes a pre-setting definite value. The parameter generating circuit is configured to obtain parameters of at least one target parametric combination of the parametric combinations according to the at least one related stimulation value, and provide the parameters of the at least one target parametric combination to be the productive capacity parameters of the production line.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2 depicts a flow chart of a method for a method for determining productive capacity parameters according to one embodiment of the present disclosure.

DETAILED DESCRIPTION

Figure 1:
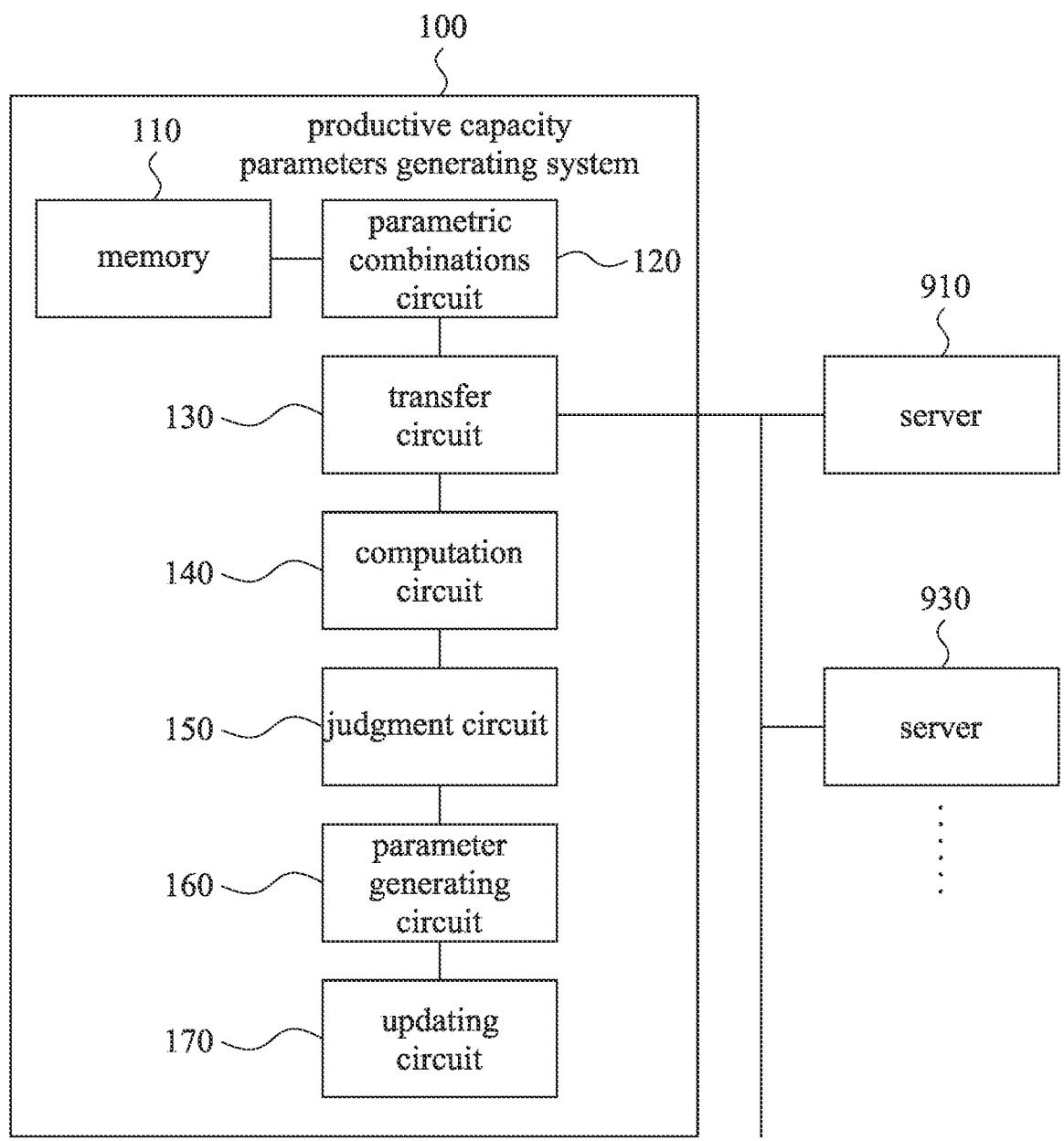
FIG. 1 depicts a schematic diagram of a productive capacity parameters generating system according to one embodiment of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

In this document, the terms used herein are merely used to describe specific embodiments, and does not intend to limit the present invention. Singular form, such as "a", "this", "such", "present one" or "the", used herein also include plural forms.

In the following description and in the claims, the terms "include" and "comprise" are used in an open-ended fashion, and thus should be interpreted to mean "include, but not limited to." As used herein, the term "and/or" includes any and all combinations of one or more of the associated listed items.

In this document, although the terms "first," "second," etc., may be used herein to describe various elements, these terms are used to distinguish one element from another.

Unless the context indicates otherwise clearly, these terms does not specifically refer to or imply order or sequence, nor does they intend to limit the present invention.

FIG. 1 depicts a schematic diagram of a productive capacity parameters generating system according to one embodiment of the present disclosure. As shown in FIG. 1, in some embodiments, the productive capacity parameters generating system 100 includes a memory 110, a parametric combinations circuit 120, a transfer circuit 130, a computation circuit 140, a judgment circuit 150, a parameter generating circuit 160, and an updating circuit 170. In some embodiments, the productive capacity parameters generating system 100 includes a personal computer, a notebook, or a server.

In some embodiments, the memory 110 includes flash memories, hard disk drivers (HDD), solid state drives (SSD), dynamic random access memories (DRAM), and static random access memories (SRAM). In some embodiments, the memory 110 can store instructions.

In some embodiments, each of the parametric combinations circuit 120, the transfer circuit 130, the computation circuit 140, the judgment circuit 150, the parameter generating circuit 160, and the updating circuit 170 includes but not limited to a single processor and the integration of many micro-processors, for example, central processors (Central Processing Unit, CPU) or graphic processors (Graphic Processing Unit, GPU) and so on.

In some embodiments, each of the parametric combinations circuit 120, the transfer circuit 130, the computation circuit 140, the judgment circuit 150, the parameter generating circuit 160, and the updating circuit 170 also includes software, firmware, hardware or any aforementioned combinations. The parametric combinations circuit 120 is coupled to the memory 110, therefore, parametric combinations circuit 120 can read an instruction from the memory 110, and execute a specific application program according to the instruction so as to transport to the transfer circuit 130, the computation circuit 140, the judgment circuit 150, the parameter generating circuit 160, and the updating circuit 170 sequentially. The aforementioned circuits of the productive capacity parameters generating system execute a method described in the following paragraphs so as to optimize productive capacity.

In some embodiments, the transfer circuit 130 can be coupled to a server 910 and a server 930. The server 910 and the server 930 can be configured to assist the transfer circuit 130 in calculation. In order to facilitate the understanding of the method for optimizing production capacity, detail steps will be explained in the following paragraphs.

FIG. 2 depicts a flow chart of a method for a method for determining productive capacity parameters according to one embodiment of the present disclosure. As shown in FIG. 2, in some embodiments, the method 200 for determining productive capacity parameters can be executed by the productive capacity parameters generating system 100 shown in FIG. 1. In some embodiments, the detail steps of the method 200 for determining productive capacity parameters will be explained in the following paragraphs.

The step 210 is performed to obtain a plurality of parameters of a production line from a memory. In some embodiments, the plurality of parameters of the production line is obtained from the memory 110.

The step 220 is performed to combine the parameters of the production line to obtain a plurality of parametric combinations so as to generate a plurality of production capacity values by a productive capacity parameters generating system, which the production capacity values includes productions of the production line per preset time.

In some embodiments, the parametric combinations circuit 120 of the productive capacity parameters generating system 100 can combine the plurality of parameters of the production line so as to obtain a plurality of parametric combinations, and calculate a plurality of production capacity values corresponding to the plurality of parametric combinations. For example, a production line may include robot arms, fixtures, transmission bands, assembly machines, etc. The aforementioned device include corresponding device parameters, such as a move time of the robot arms, an average test time of the fixtures, a number of the fixtures, an average assembling time of the assembly machines, etc. The parametric combinations circuit 120 adjusts one parameter of the aforementioned parameters respectively, and combines the adjusted parameters to obtain the plurality of parametric combinations respectively. The transfer circuit 130 of the productive capacity parameters generating system 100 transports the plurality of parametric combinations to the server 910 and the server 930 to calculate the plurality of production capacity values corresponding to the parametric combinations. After that, the server 910 and the server 930 transport the production capacity values to the transfer circuit 130. Then, the transfer circuit 130 transports the production capacity values to the computation circuit 140.

In some embodiments, users set initial parameters of the production line in advance. An initial parametric combination is calculated, and a preset production capacity value is obtained according to the initial parametric combination by the parametric combinations circuit 120. Then, a goal of users is to obtain the best production capacity of the production line, and users set a standard to expect a stimulated result which can meet the standard through the method for optimizing production capacity. For example, relative values are listed as follow:

TABLE 1

| parameter setting | | | | |
|---|---|---|---|---|
| robot arms | fixtures | Screw machine assembly | UPH (Unit per hour) | Expected UPH |
| MvT: 1 | MT: 1 Q: 1 | CT: 40 | 87 | 90 |

Please refer to table 1, MvT is the move time of the robot arms, MT is the average test time of the fixtures, Q is the number of the fixtures, CT is an average assembling time of the screw machine, and UPH (Unit per hour) is a production capacity value of the parametric combinations which is calculated by a stimulation software. The production capacity values include per production unit of the production line per preset time, but not limited to UPH. The stimulation software can be a kind of customized modeling software such as flexsim. The expected UPH is the standard of production capacity which meets an expect result of users.

In some embodiments, the parametric combinations circuit 120 adjusts the initial parameters which are set up by users respectively, the parametric combinations circuit 120 calculates the production capacity values and the stimulation values according to adjusted parameters. Each of parametric combination which one of the parameters is adjusted once is regarded as a new parametric combination. For example, relative values are listed as follow:

TABLE 2

| parametric combinations | parameter setting | | | | stimulation values |
| --- | --- | --- | --- | --- | --- |
| | robot arms | fixtures | Screw machine assembly | UPH | p = 0.8 threshold = 0.83 |
| First | MvT: 1 | MT: 1 Q: 1 | CT: 36 | 100 | 0.945 |
| Second | MvT: 1 | MT: 0.9 Q: 1 | CT 40 | 85 | −0.167 |
| Third | MvT: 1 | MT: 1 Q: 11 | CT: 40 | 90 | −0.078 |
| Forth | MvT: 0.9 | MT: 1 Q: 1 | CT: 40 | 93 | 0.47 |

Please refer to table 2, stimulation values is a value which is calculated according to the production capacity values and the adjusted parameters, the rest of parameters is the same as the parameters shown in table 1, and repetitious details are omitted herein.

The step 230 is performed to calculate a plurality of stimulation values according to the production capacity values and the parameters of the parametric combinations by the productive capacity parameters generating system. The calculation of obtaining a plurality of stimulation values is listed as follow:

$$\text{Simulation Value} = \frac{p(\text{Delta } UPH)}{|\text{Delta parameter}|} \quad \text{formula 1}$$

As shown in formula 1, p is a production capacity correlation coefficient, and a value of p is set up by users. The range of p is from 0 to 1. When p is closer to 1, a calculated result of the production line which users expect is more focused on production capacity of the production line. Please refer to and compare with the UPH shown in table 1 and table 2, Delta UPH is a difference between each of production capacity value which is calculated according to the parametric combinations and a preset production capacity value. Please refer to and compare with the parameters of production line shown in table 1 and table 2, Delta parameter is an absolute value of a difference between the initial parameter and each of the adjusted parameters of production line parameters. In some embodiments, users can set up every production line parameters mentioned in the aforementioned embodiments in advance. The parametric combinations circuit 120 executes the step 220 to combine the parameters of the production line to obtain the parametric combinations so as to generate a preset production capacity value, and then calculate the formula 1 according to the production capacity values.

In some embodiments, as shown in formula 1, the computation circuit 140 of the productive capacity parameters generating system subtracts the preset production capacity value from each of production capacity values corresponding to the parametric combinations, and multiplies by the correlation coefficient p of production capacity. After that, the aforementioned result is divided by the difference between the parameters and each of the adjusted parameters. Finally, the stimulation values are obtained.

The step 240 is performed to set up at least one of the stimulation values as at least one related stimulation value by the productive capacity parameters generating system based on the at least one of the stimulation values being greater than or equal to a preset threshold, which the preset threshold includes a pre-setting definite value. In some embodiments, the preset threshold is a statistical result from a large number of production line data after big data analysis. But users can adjust the preset threshold according to actual needs of production line in the industry.

In some embodiments, the judgment circuit 150 determines whether there are the stimulation values that meet the needs of users according to the stimulation values and the preset threshold. The stimulation values that meet the needs of users are the at least one related stimulation value.

The step 250 is performed to obtain parameters of at least one target parametric combination of the parametric combinations according to the at least one related stimulation value by the productive capacity parameters generating system.

In some embodiments, the parameter generating circuit 160 further determines a target stimulation value that meets the needs of users according to the at least one related stimulation value, the parameters of at least one parametric combination corresponding to the target stimulation values are the parameters corresponding to maximum production capacity of the production line.

The step 260 is performed to provide the parameters of the at least one target parametric combination to be the productive capacity parameters of the production line by the productive capacity parameters generating system.

In some embodiments, the productive capacity parameters generating system 100 provides the parameters of the at least one target parametric combination to be the productive capacity parameters for the production line in the future.

Figure 3:
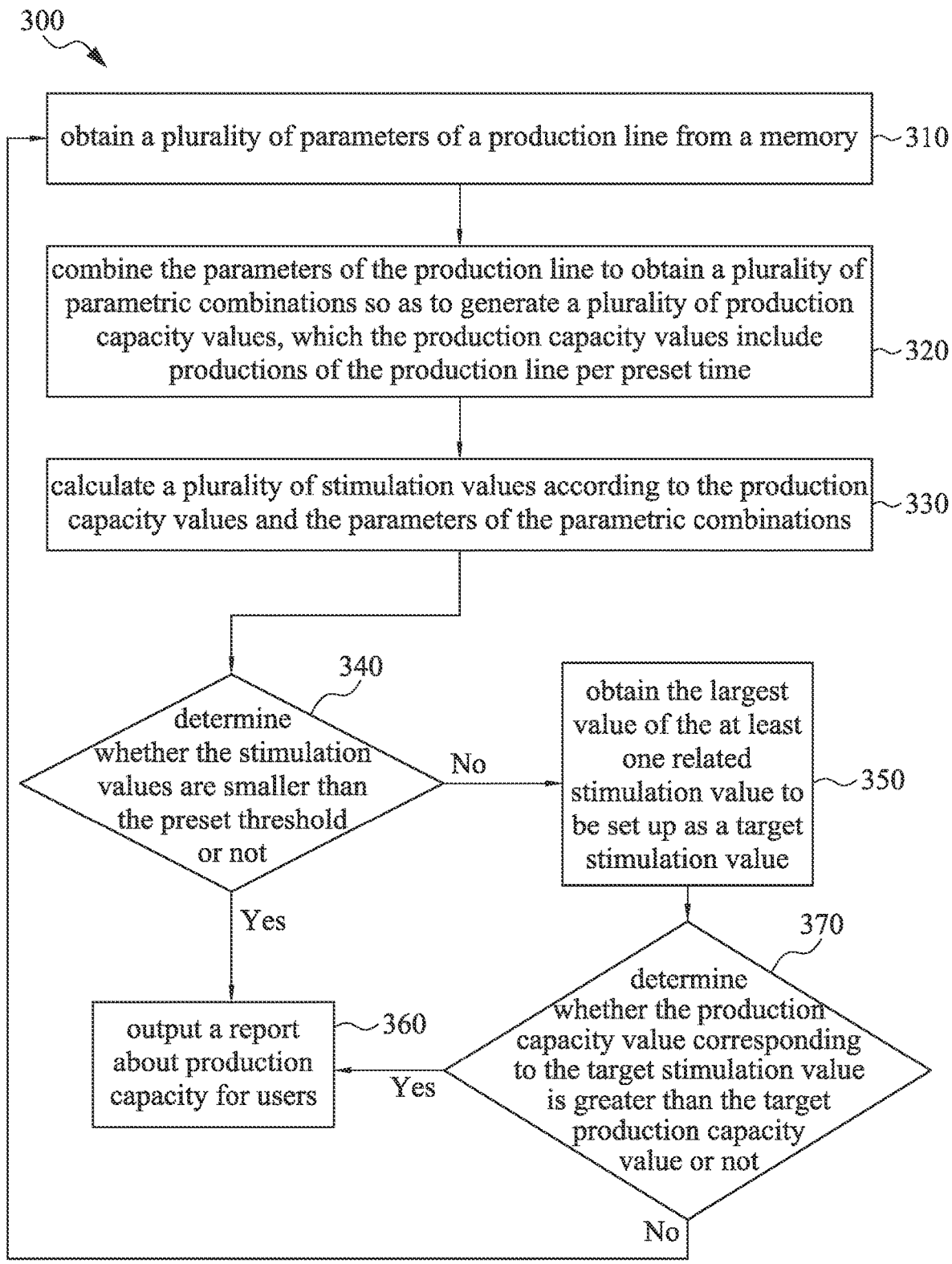
FIG. 3 depicts a detailed flow chart of a method for determining productive capacity parameters according to one embodiment of the present disclosure.

FIG. 3 depicts a detailed flow chart of a method for determining productive capacity parameters according to one embodiment of the present disclosure. It is especially a detailed step of the method 300 for determining productive capacity parameters. In some embodiments, the method 300 for determining productive capacity parameters is executed by the productive capacity parameters generating system 100 shown in FIG. 1. In some embodiments, the detail steps of the method 300 for determining productive capacity parameters will be described in the following paragraphs.

The step 310 is performed to obtain a plurality of parameters of a production line from a memory. In some embodiments, the parameters of the production line are obtained from the memory 110.

The step 320 is performed to combine the parameters of the production line to obtain a plurality of parametric combinations so as to generate a plurality of production capacity values. In some embodiments, the parametric combinations circuit 120 combines the plurality of parameters of the production line to obtain parametric combinations so as to generate a plurality of production capacity values.

The step 330 is performed to calculate a plurality of stimulation values according to the production capacity values and the parameters of the parametric combinations. In some embodiments, the computation circuit 140 calculates the plurality of stimulation values according to the production capacity values and the parameters of the parametric combinations.

The step 340 is performed to determine whether the stimulation values are smaller than the preset threshold or not. In some embodiments, the judgment circuit 150 determines whether the stimulation values are smaller than the preset threshold or not. If the judgment circuit 150 determines that the stimulation values are all smaller than the preset threshold, the judgment circuit 150 executes the step 360. It is noted that the judgment circuit 150 determines that the stimulation values are all smaller than the preset threshold. It means that the calculated production capacities are all lower than the target production capacity which users set up. It means that the production capacity cannot be increased no matter how the parameters are adjusted. It also means that the result of optimizing production capacity cannot be improved. Therefore, the step 360 is executed, and the parameter generating circuit 160 outputs a related report about the plurality of parameters of the parametric combinations for users.

In step 340, based on the stimulation values being not all smaller than the preset threshold, the step 350 is executed. In some embodiments, based on stimulation values being not all smaller than the preset threshold, the judgment circuit 150 sets up the stimulation values which is greater than the preset threshold as at least one related stimulation value, and executes the step 350.

In some embodiments, two or more of the stimulation values may not be less than the preset threshold. The stimulation values which are not less than the preset threshold can be set up as at least one related stimulation values. After that, the step 350 is performed to obtain the largest value of the at least one related stimulation value to be set up as a target stimulation value. Then, the parameters of the at least one target parametric combination are obtained from the parametric combinations according to the target stimulation values.

The step 370 is performed to determine whether the production capacity value corresponding to the target stimulation value is greater than the target production capacity value or not.

In some embodiments, the judgment circuit 150 executes the step 370, and further determines a result of the step 350. For example, the judgment circuit 150 determines whether the production capacity value corresponding to the target stimulation value is greater than the target production capacity value or not. Based on the production capacity value which is greater than target production capacity value is determined, the parameter generating circuit 160 obtains the parameters of the at least one target parametric combination from the parametric combination, which are the parameters corresponding to maximum production capacity of the production line. After that, the parameter generating circuit 160 executes the step 360, and outputs the result as a report about maximum production capacity of the production line to provide users for establishing the production line.

In some embodiments, the judgment circuit 150 executes the step 360. Based on the production capacity value which is not greater than the target production capacity value is determined, the updating circuit 170 updates the preset production capacity value according to the largest production capacity value corresponding to target stimulation value. Then, the parametric combinations circuit 120 re-executes the step 320 to combine the parameters of the production line to obtain a plurality of parametric combinations so as to calculate a plurality of production capacity values according to the plurality of parametric combinations and the updated preset production capacity value.

In some embodiments, the computation circuit 140 executes the step 330, uses the updated preset production capacity value as a standard for calculating stimulation values, and does calculation related to the present disclosure based on the standard. For example, the computation circuit 140 recalculates the Delta UPH in formula 1 according to the updated preset production capacity value. In other words, the computation circuit 140 recalculates differences between each of production capacity values and the updated preset production capacity value, and substitutes the values into the formula 1 to do calculations. Therefore, the updating circuit 170 updates the preset production capacity value, the parametric combinations circuit 120, the transfer circuit 130, the computation circuit 140, the judgment circuit 150, and the parameter generating circuit 160 re-execute from the step 320 to the step 370 until the judgment circuit 150 finds out the parameters of the production line corresponding to target stimulation values which meet the need of users. The parameter generating circuit 160 executes the step 360 to output a report about related production capacity for users.

Based on the aforementioned embodiments, the present disclosure provides a method for a method for determining productive capacity parameters and a productive capacity parameters generating system to generate stimulated results of different parameters by a large number of multiprocessor parallel servers and find out maximum of a production line or a the most profitable setting value without actual production line data and adjusting the content of the production line with labor costs manually so as to provide an improvement goal according to the stimulated result.

Although the present invention has been described in considerable detail with reference to certain embodiments thereof, it will be apparent to those skilled in the art that various modifications and variations can be made to the structure of the present invention without departing from the scope or spirit of the invention. As a result, it is intended that the present invention cover modifications and variations of this invention provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for determining productive capacity parameters, comprising:
   obtaining a plurality of parameters of a production line from a memory;
   combining the parameters of the production line to obtain a plurality of parametric combinations so as to generate a plurality of production capacity values by a productive capacity parameters generating system, wherein the production capacity values comprise productions of the production line per preset time;
   calculating a plurality of stimulation values according to the production capacity values and the parameters of the parametric combinations by the productive capacity parameters generating system;
   setting up at least one of the stimulation values as at least one related stimulation value by the productive capacity parameters generating system based on the at least one of the stimulation values being greater than or equal to a preset threshold, wherein the preset threshold comprises a pre-setting definite value;
   obtaining parameters of at least one target parametric combination of the parametric combinations according to the at least one related stimulation value by the productive capacity parameters generating system; and
   providing the parameters of the at least one target parametric combination to be the productive capacity parameters of the production line by the productive capacity parameters generating system.

2. The method for determining productive capacity parameters of claim 1, wherein the parameters comprise a plurality of device parameters of a plurality of device of the production line.

3. The method for determining productive capacity parameters of claim 1, wherein calculating the plurality of stimulation values according to the production capacity values and the parameters of the parametric combinations comprises:

$$\text{Simulation Value} = \frac{p(\text{Delta } UPH)}{|\text{Delta parameter}|}$$

wherein Simulation Value is the stimulation values, wherein p is a production capacity correlation coefficient, wherein Delta UPH is a difference between each of the production capacity values and a preset production capacity value, wherein Delta parameter is an absolute value of difference between an initial parametric combination and each of the parametric combinations.

4. The method for determining productive capacity parameters of claim 1, wherein setting up the at least one of the stimulation values as the at least one related stimulation value based on the at least one of the stimulation values being greater than or equal to the preset threshold further comprises:
   outputting the parameters of the parametric combinations based on the stimulation values being all smaller than the preset threshold.

5. The method for determining productive capacity parameters of claim 1, wherein obtaining the parameters of the at least one target parametric combination from the parametric combinations according to the at least one related stimulation value comprises:
   obtaining the largest value of the at least one related stimulation value to be set up as a target stimulation value; and
   obtaining the parameters of the at least one target parametric combination of the parametric combinations according to the target stimulation value.

6. The method for determining productive capacity parameters of claim 5, wherein obtaining the parameters of the at least one target parametric combination from the parametric combinations according to the at least one related stimulation value further comprises:
   obtaining the parameters of the at least one target parametric combination of the parametric combinations according to the target stimulation value based on the production capacity value corresponding to the target stimulation value being greater than a target production capacity value.

7. The method for determining productive capacity parameters of claim 6, wherein obtaining the parameters of the at least one target parametric combination from the parametric combinations according to the at least one related stimulation value further comprises:
   updating a preset production capacity value according to the production capacity value corresponding to the target stimulation value based on the production capacity value corresponding to the target stimulation value being not greater than the target production capacity value;
   wherein combining the parameters of the production line to obtain the plurality of parametric combinations so as to generate the plurality of production capacity values comprises:
   combining the parameters of the production line to obtain the plurality of parametric combinations, and calculating the production capacity values according to the parametric combinations and the preset production capacity value.

8. A productive capacity parameters generating system, comprising:
   a memory, configured to store a plurality of parameters of a production line;
   a parametric combinations circuit, configured to combine the parameters of the production line to obtain a plurality of parametric combinations;
   a transfer circuit, configured to transfer the parametric combinations to a plurality of servers so as to obtain a plurality of production capacity values, wherein the production capacity values comprise productions of the production line per preset time;
   a computation circuit, configured to calculate a plurality of stimulation values according to the production capacity values and the parameters of the parametric combinations;
   a judgment circuit, wherein based on the at least one of the stimulation values being greater than or equal to a preset threshold, the judgment circuit is configured to set up at least one of the stimulation values as at least one related stimulation value, wherein the preset threshold comprises a pre-setting definite value; and
   a parameter generating circuit, configured to obtain parameters of at least one target parametric combination of the parametric combinations according to the at least one related stimulation value, and provide the parameters of the at least one target parametric combination to be the productive capacity parameters of the production line.

9. The productive capacity parameters generating system of claim 8, wherein the judgment circuit is configured to determine whether the stimulation values are smaller than the preset threshold or not, wherein based on the stimulation values being all smaller than the preset threshold, the parameter generating circuit outputs the parameters of the parametric combinations.

10. The productive capacity parameters generating system of claim 8, wherein the parameter generating circuit is configured to obtain the largest value of the at least one related stimulation value to set up as a target stimulation value, and obtain the parameters of the at least one target parametric combination of the parametric combinations according to the target stimulation value.

11. The productive capacity parameters generating system of claim 10, wherein the judgment circuit is configured to determine whether a production capacity value corresponding to the target stimulation value is greater than a production capacity value or not, wherein based on the production capacity value being greater than the target production capacity value, the parameter generating circuit is configured to obtain the parameters of the at least one target parametric combination of the parametric combinations according to the target stimulation value.

12. The productive capacity parameters generating system of claim 11, wherein the judgment circuit is configured to determine whether the production capacity value corresponding to the target stimulation value is greater than the target production capacity value or not, wherein the productive capacity parameters generating system further comprises an updating circuit, wherein based on the production capacity value being not greater than the target production capacity value, the updating circuit is configured to update a preset production capacity value according to the production capacity value corresponding to the target stimulation value, wherein the parametric combinations circuit combines the parameters of the production line to obtain the plurality of parametric combinations, wherein the computation circuit calculates the production capacity values according to the parametric combinations and the preset production capacity value.

* * * * *